US007382036B2

(12) United States Patent
Nowak et al.

(10) Patent No.: US 7,382,036 B2
(45) Date of Patent: Jun. 3, 2008

(54) DOPED SINGLE CRYSTAL SILICON SILICIDED EFUSE

(75) Inventors: Edward J. Nowak, Essex Junction, VT (US); Jed H. Rankin, South Burlington, VT (US); William R. Tonti, Essex Junction, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 11/161,320

(22) Filed: Jul. 29, 2005

(65) Prior Publication Data
US 2007/0026579 A1   Feb. 1, 2007

(51) Int. Cl.
*H01L 27/148* (2006.01)
(52) U.S. Cl. .............. 257/529; 257/532; 257/531; 257/E21.592; 257/E23.149
(58) Field of Classification Search ........ 257/529–532; 438/281, 601
See application file for complete search history.

(56) References Cited

U.S. PATENT DOCUMENTS

| | | | |
|---|---|---|---|
| 4,517,583 A | 5/1985 | Uchida | |
| 5,444,287 A | 8/1995 | Bezama et al. | |
| 5,882,998 A | 3/1999 | Sur, Jr. et al. | |
| 6,307,213 B1 | 10/2001 | Huang et al. | |
| 6,368,902 B1 | 4/2002 | Kothandaraman et al. | |
| 6,432,760 B1 | 8/2002 | Kothandaraman et al. | |
| 6,633,055 B2 | 10/2003 | Bertin et al. | |
| 6,653,710 B2 * | 11/2003 | Adkisson et al. ........... | 257/529 |
| 6,661,330 B1 * | 12/2003 | Young ......................... | 337/297 |
| 6,774,439 B2 | 8/2004 | Fukuzumi et al. | |
| 7,153,712 B1 * | 12/2006 | Sidhu et al. ................. | 438/17 |
| 7,176,551 B2 * | 2/2007 | Cheng et al. ............... | 257/529 |

(Continued)

FOREIGN PATENT DOCUMENTS

JP             61268041          11/1986

(Continued)

*Primary Examiner*—Dung A. Le
(74) *Attorney, Agent, or Firm*—Gibb & Rahman, LLC; Anthony Canale

(57) ABSTRACT

An eFuse begins with a single crystal silicon-on-insulator (SOI) structure that has a single crystal silicon layer on a first insulator layer. The single crystal silicon layer is patterned into a strip. Before or after the patterning, the single crystal silicon layer is doped with one or more impurities. At least an upper portion of the single crystal silicon layer is then silicided to form a silicided strip. In one embodiment the entire single crystal silicon strip is silicided to create a silicide strip. Second insulator(s) is/are formed on the silicide strip, so as to isolate the silicided strip from surrounding structures. Before or after forming the second insulators, the method forms electrical contacts through the second insulators to ends of the silicided strip. By utilizing a single crystal silicon strip, any form of semiconductor, such as a diode, conductor, insulator, transistor, etc. can form the underlying portion of the fuse structure. The overlying silicide material allows the fuse to act as a conductor in its unprogrammed state. However, contrary to metal or polysilicon based eFuses which only comprise an insulator in the programmed state, when the inventive eFuse is programmed (and the silicide is moved or broken) the underlying semiconductor structure operates as an active semiconductor device.

15 Claims, 17 Drawing Sheets

U.S. PATENT DOCUMENTS

| | | |
|---|---|---|
| 2002/0033519 A1 | 3/2002 | Babcock et al. |
| 2003/0134456 A1 | 7/2003 | Wang et al. |
| 2003/0234435 A1 | 12/2003 | Zimmerman et al. |
| 2004/0036090 A1 | 2/2004 | Wang et al. |
| 2004/0038458 A1 | 2/2004 | Marr |
| 2004/0181724 A1 | 9/2004 | McBride |

FOREIGN PATENT DOCUMENTS

| | | |
|---|---|---|
| JP | 8264654 | 10/1996 |
| JP | 11087522 | 3/1999 |
| JP | 2001057139 | 2/2001 |
| JP | 2004134091 | 4/2004 |
| WO | WO 0188981 | 7/2002 |

* cited by examiner

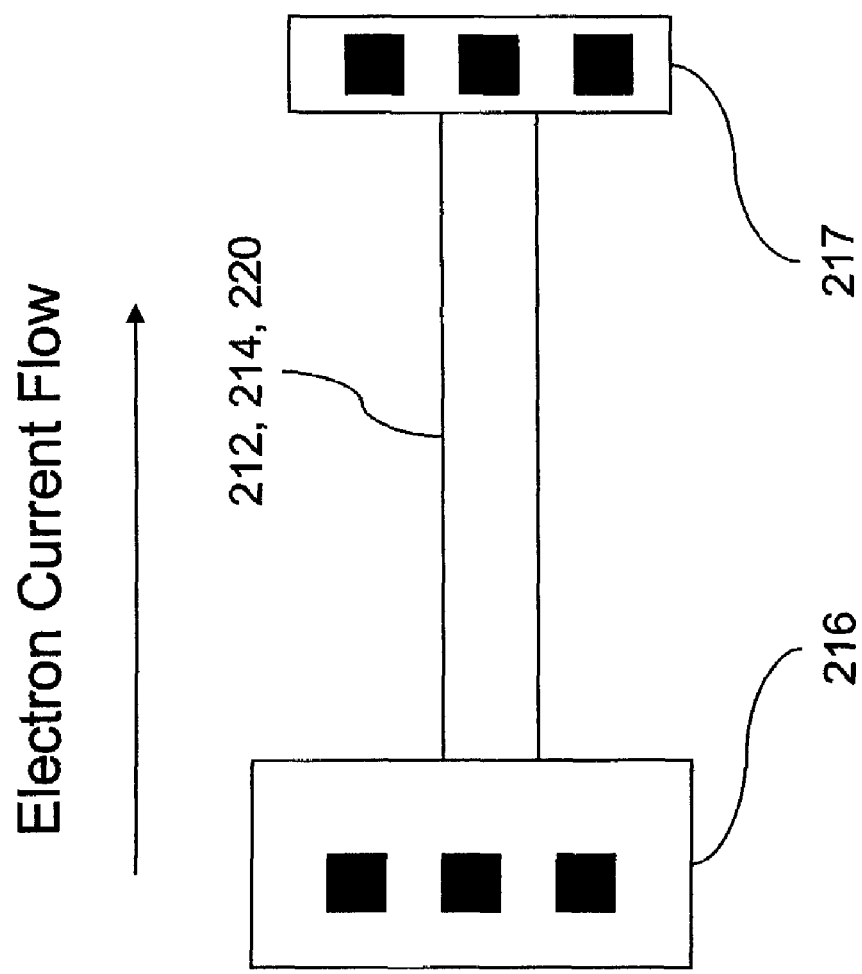

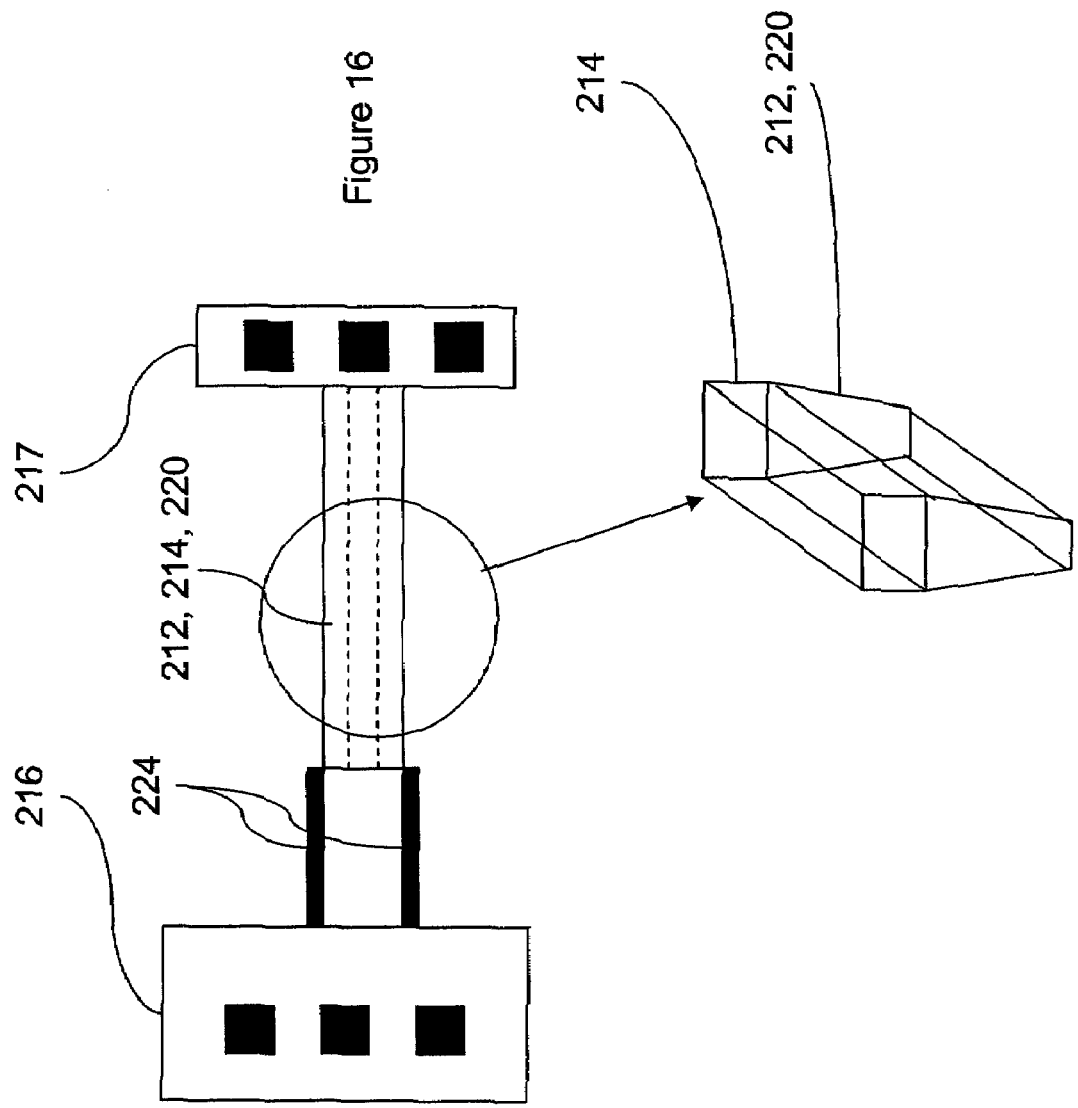

DOPED SINGLE CRYSTAL SILICON SILICIDED EFUSE

BACKGROUND OF THE INVENTION

1. Field of the Invention

The invention generally relates to eFuses and more particularly to a silicided single crystal silicon eFuse.

2. Description of the Related Art

The below-referenced U.S. patents disclose embodiments that were satisfactory for the purposes for which they were intended. The disclosures of the below-referenced U.S. patents and Publications (sometimes referred to herein as "conventional references"), in their entireties, are hereby expressly incorporated by reference into the present invention for purposes including, but not limited to, indicating the background of the present invention and illustrating the state of the art. U.S. Publications 2003/01344556, and 2002/0033519; and U.S. Pat. Nos. 6,633,055, 6,432,760, and 6,368,902 discloses conventional eFuses that utilize silicided polysilicon.

As discussed in the conventional references, computers typically have various types of devices which store data, such as memory devices. One type of memory device is a read only memory (ROM) device in which data is permanently stored and cannot be overwritten or otherwise altered. Thus, ROM devices are useful whenever unalterable data or instructions are required. ROM devices are also non-volatile devices, meaning that the data is not destroyed when power is shut off. ROM devices are typically programmed during fabrication by making permanent electrical connections in selected portions of the memory device. One disadvantage of ROM devices is that their programming is permanently determined during fabrication and, therefore, can only be changed by redesign.

Another type of memory device is a programmable read only memory (PROM) device. Unlike ROM devices, PROM devices are programmable after their design and fabrication. To render them programmable, PROM devices are typically provided with an electrical connection in the form of a fusible link (fuse). There are a considerable number of fuse designs used in PROM devices. Perhaps the most common fuse design is a metal or polysilicon layer which is narrowed or "necked down" in one region. To blow the fuse, a relatively high electrical current is driven though the metal or polysilicon layer. The current heats the metal or polysilicon above its melting point, thereby breaking the conductive link and making the metal layer or polysilicon discontinuous, or high resistance. Typically, the conductive link breaks in the narrowed region because the current density (and temperature) is highest in that region. The PROM device is thus programmed to conducting and non-conducting patterns, thereby forming the 1 or 0 comprising the data stored in the memory device.

Rather than employing an electrical current, a laser can be employed to blow the fuses. Using lasers instead of electrical current to blow fuses, however, has become more difficult as the size of memory devices decreases. As memory devices decrease in size and the degree of integration increases, the critical dimensions (e.g., fuse pitch) of memory cells become smaller. The availability of lasers suitable to blow the fuse becomes limited since the diameter of the laser beam should not be smaller than the fuse pitch. Thus, the fuse pitch, and the size of memory devices, becomes dictated by minimum diameter of laser beams obtainable by current laser technology.

The ability of electrical currents to blow fuses could aid in adapting fuses for a variety of applications, such as redundancy technology. Redundancy technology improves the fabrication yield of high-density memory devices, such as SRAM and DRAM devices, by replacing failed memory cells with spare ones using redundant circuitry which is activated by blowing fuses. Using laser beams to blow the fuses limits the size. Using electrical currents instead to blow fuses, therefore, has a greater potential for high-degree integration and decreased size of memory devices.

SUMMARY OF THE INVENTION

A method of forming an eFuse is described below. This method begins with a single crystal silicon-on-insulator (SOI) structure that has a single crystal silicon layer on a first insulator layer. The single crystal silicon layer is patterned into a strip. Before or after the patterning, the single crystal silicon layer can be doped with one or more impurities. At least an upper portion of the single crystal silicon layer is then silicided to form a silicided strip. In one embodiment, discussed in greater detail below, the entire single crystal silicon strip is silicided to create a silicide strip. Second insulator(s) is/are formed on the silicide strip, so as to isolate electrically and thermally the silicided strip from surrounding structures. Before or after forming the second insulators, the method forms electrical contacts through the second insulators to ends of the silicided strip, thereby completing the fuse structure.

In its unblown state, the fuse acts as any normal conductor having electrical properties (resistance and capacitance) consistent with its material specifications. However, when sufficient current is passed through the conductor, the silicide melts and migrates in the direction of the current flow, or the electron wind. This melting process "blows," "programs," or "activates" the fuse. The process of blowing the fuse is permanent in that the conductivity of the fuse is permanently changed after the fuse blowing process. The silicide has a lower melting point than the underlying doped silicon strip. Therefore, the doped silicon strip is substantially unaffected during the process of blowing the fuse. While in its melted state during the fuse blowing process, the silicide moves from a first position, or cathode covering all of the doped single crystal silicon island to a second position, or anode covering only one end of the doped single crystal silicon island. After the fuse blowing process, the silicide returns to a solid state and its position is thereby permanently changed.

When doping the single crystal silicon layer, the method can dope a first region of the single crystal silicon layer to have a first doping polarity and dope a second region of the single crystal silicon layer to have a second doping polarity, opposite to the first doping polarity. Further, the doping process can leave one or more regions of the single crystal silicon layer undoped. The one or more undoped regions of the single crystal silicon layer limits current flow through the single crystal silicon layer. This doping process can, for example, form a N+P or P+N diode in the single crystal silicon layer. Therefore, the invention can comprise a normal conductor in an unblown state and comprise an active device such as a diode in its blown state.

When passing current through the electrical contacts, current flows from a first end (cathode) of the silicided strip to a second end (anode) of the silicided strip. In order to avoid damaging the contacts, the method forms a first contact at the cathode that is larger than a second contact at the second end of the anode.

The method performs a number of steps to reduce the power required to program the fuse. In one embodiment, the method forms stress-producing sidewall spacers along sidewalls of the strip of the single crystal silicon layer. The stress-producing sidewall spacers reduce the power required to program the fuse. Similarly, when patterning the strip of single crystal silicon, the method can perform an etching process to taper the lower portion of the strip of the single crystal silicon layer. Again, the tapering lowers the power required to program the fuse. Additionally, the method can oxidize one or more portions of the strip of the single crystal silicon layer so as to narrow the portions of the strip of the single crystal silicon layer. By narrowing the strip of single crystal silicon, the power required to program the fuse is also reduced.

The eFuse structure produced by the foregoing methodology comprises a strip of doped single crystal silicon on a first insulator layer, a silicide layer on the doped single crystal silicon, a second insulator layer on/around the silicide layer, and electrical contacts that extend through the second insulator layer and connect to ends of the strip of doped single crystal silicon. The structure can also include isolation regions on the insulator layer surrounding the doped single crystal silicon layer. These insulators thereby define a strip or island of single crystal silicon. The silicide layer and the doped single crystal silicon island can comprise a substantially conductive member before the silicide layer shifts position and comprise a substantially non-conductive member or active device after the silicide layer shifts position.

By utilizing single crystal silicon (as opposed to polycrystal silicon), the structure can comprise any form of semiconductor and can, therefore, include multiple doped regions which can have opposite doping polarities. For example, the doped single crystal silicon island can comprise an undoped region between doped regions that limits current flow through the doped single crystal silicon.

As discussed above, when programming the inventive eFuses, the silicide layer is adapted to move from an unblown position covering all of the doped single crystal silicon to a blown position covering only one end of the doped single crystal silicon upon application of sufficient (a predetermined quantity) current through the doped single crystal silicon. Again, during the process of programming the eFuse, a relatively large amount of current passes through the electrical contacts and through the strip of single crystal silicon. More specifically, the current flows from the first end cathode of the strip of doped single crystal silicon to the second end anode of the strip of doped single crystal silicon. In order to prevent damage to the electrical contacts, the inventive structure provides a first contact at the first end of the strip of doped single crystal silicon that is larger than a second contact at the second end of the strip of doped single crystal silicon.

As mentioned above, the structure can include stress-producing sidewall spacers lining sidewalls of the strip of doped single crystal silicon. Additionally, the bottom portion (the portion opposite the top portion that will be silicided) can be tapered. Further, various portions of the single crystal silicon strip can be narrowed through oxidation processes.

As mentioned above, in one embodiment, the invention can silicide the entire depth of the strip of single crystal silicon, thereby producing a silicide strip that is all silicide. This method provides the single crystal silicon-on-insulator (SOI) structure, patterns the single crystal silicon layer into a strip, silicides all of the single crystal silicon layer to form the silicide strip, forms at least one second insulator on and around the silicide strip so as to isolate the silicide strip from surrounding structures, and forms electrical contacts through the second insulator to ends of the silicide strip.

This produces an eFuse structure having a strip of silicide on a first insulator layer, a second insulator layer on the silicide, and electrical contacts extending through the second insulator layer and connecting to ends of the strip of silicide. The silicide layer is adapted to melt and migrate under an electron wind and subsequently become discontinuous upon application of current through the silicide layer. This eFuse comprises a conductor in an un-blown state and comprises an insulator or open circuit between the anode and cathode in a blown state.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIG. 13 is schematic top-view diagram of an eFuse according to embodiments herein;

FIG. 16 is schematic top-view diagram of an eFuse according to embodiments herein;

FIG. 17 is schematic perspective-view diagram of a portion of an eFuse according to embodiments herein.

DETAILED DESCRIPTION OF PREFERRED EMBODIMENTS OF THE INVENTION

Figure 1:
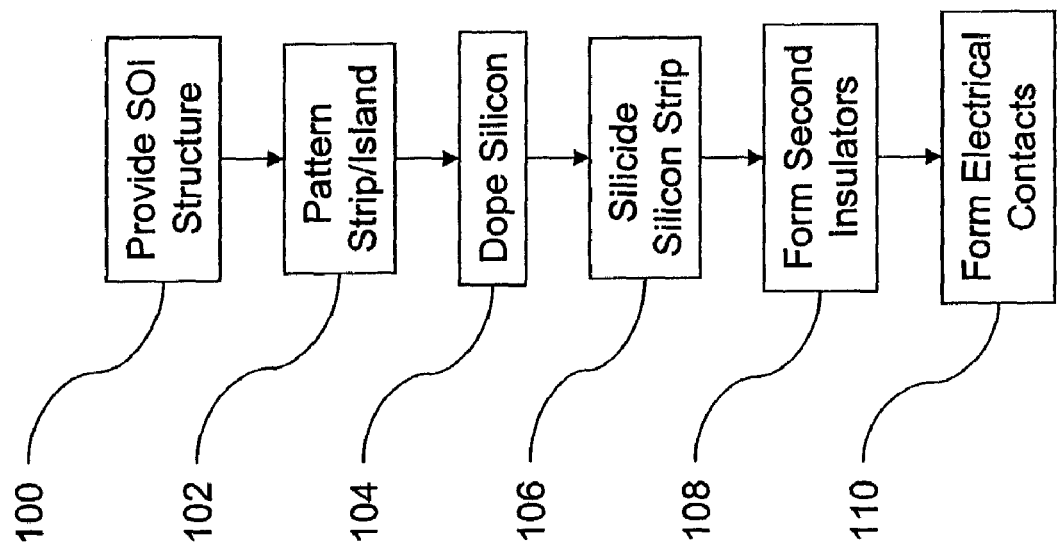
FIG. 1 is a flow chart illustrating the embodiments of the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Conventional two terminal eFuses (electronically programmable fuses) utilize a metallic or polysilicon strip which may or may not be silicided. Therefore, conventional eFuses can only be changed between conductors and insulators. The invention described below instead utilizes a single crystal silicon strip that is silicided in an eFuse structure. By utilizing a single crystal silicon strip, any form of semiconductor, such as a diode, conductor, insulator, transistor, etc. can form the underlying portion of the fuse structure. The overlying silicide material allows the fuse to act as a conductor in its unprogrammed state. However, contrary to metal or polysilicon based eFuses which only comprise an insulator in the programmed state, when the inventive eFuse is programmed (and the silicide is moved or broken) the underlying semiconductor structure operates as an active semiconductor device.

Therefore, for example, one embodiment of the invention forms a diode in the single crystal silicon strip that underlies the highly-conductive silicide. In its unprogrammed state, the silicide provides a high level of conductivity allowing the fuse to act as a wire or conductor. In its programmed state, with silicide migration taking place, the underlying N+P or P+N (separate or in combination) diode operates as any conventional semiconductor diode, thereby restricting current flow in one (i.e. the blocking or reverse) direction. The invention can also create a PNPN structure that can be dual if desired. Other similar semiconductor structures will act similarly with the invention. Further, by utilizing single crystal silicon, additional techniques can be utilized to narrow the neck (strip) of the fuse element. Further, stress inducing sidewall spacers can be formed adjacent to the strip of single crystal silicon so as to lower the power required to program the fuse.

Figure 2:
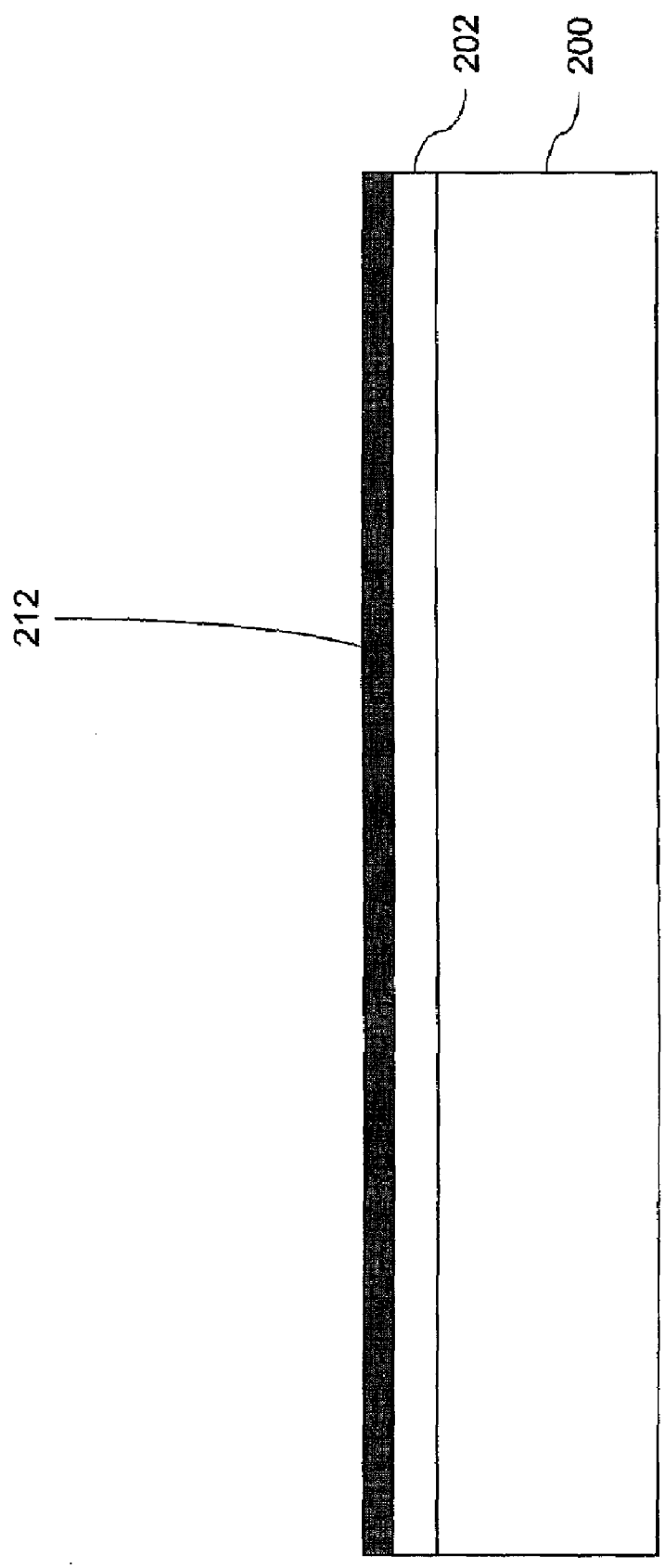
FIG. 2 is schematic cross-sectional diagram of a partially-completed eFuse according to embodiments herein.

One inventive embodiment for forming an eFuse is shown in flowchart form in FIG. 1 and illustrated in cross-section on views in FIGS. 2-6B. This method begins by providing a single crystal silicon-on-insulator (SOI) structure that has a single crystal silicon layer 212 on a first insulator layer 202 (as shown in item 100). The SOI structure 202, 212 is generally formed over a substrate 200, such as a wafer, as shown in FIG. 2.

Figure 3:
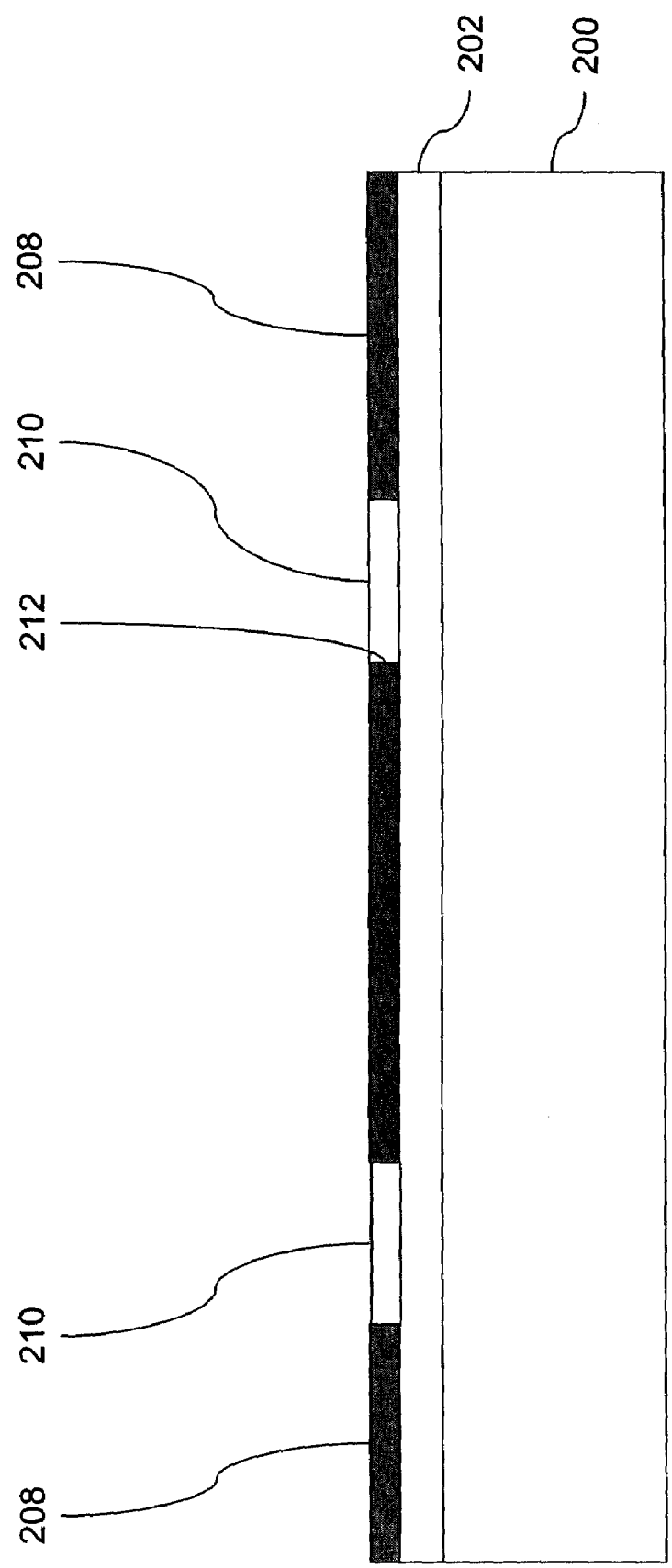
FIG. 3 is schematic cross-sectional diagram of a partially-completed eFuse according to embodiments herein.

In item 102, the single crystal silicon layer 212 is patterned into a strip, as shown in FIG. 3. The processes used to pattern the single crystal silicon 212 into a strip can include any currently known or future developed process, such as those described in the conventional references. For example, an organic photolithographic photoresist mask can be exposed, developed, and rinsed to mask the area of the single crystal silicon layer 212 that is to remain as the strip. Then, other areas of the single crystal silicon layer can be removed using any conventional or future developed removal process, such as etching, rinsing, etc. The organic mask is then removed. The areas where the single crystal silicon layer 212 was removed can be replaced with insulators, such as shallow trench isolation (STI) insulators 210. The insulators 210 electrically and thermally isolate the strip or island of single crystal silicon 212 from adjacent structures 208, which can be conductors, etc.

Figure 4:
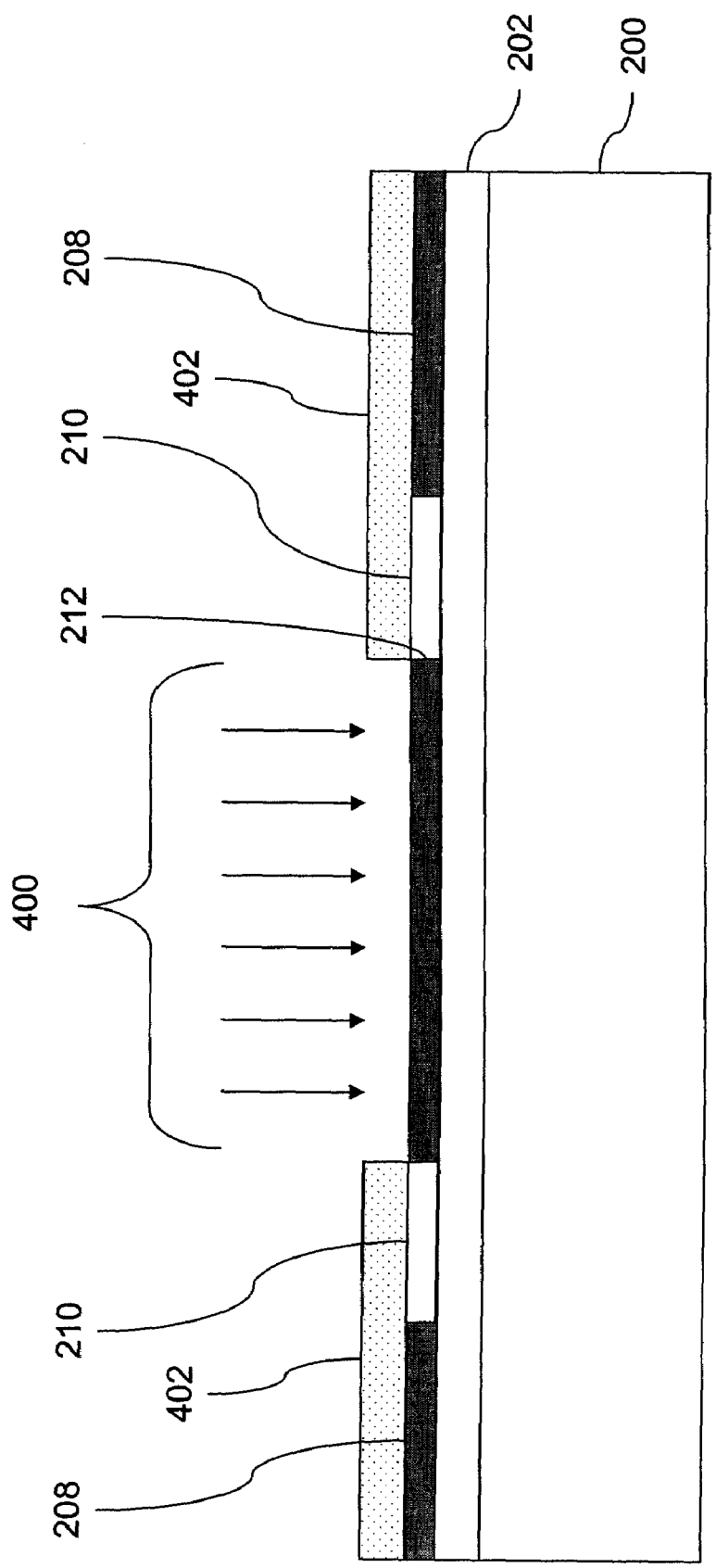
FIG. 4 is schematic cross-sectional diagram of a partially-completed eFuse according to embodiments herein.

Before or after the patterning 102, the single crystal silicon layer 212 can optionally be doped with one or more impurities, as shown in item 104 of the flowchart. For example, as shown in FIG. 4, one or more masks 402 (such as any conventional mask such as an organic photoresist) can be patterned to leave the single crystal silicon strip 212 unprotected and then one or more impurities 400 can be implemented into the single crystal silicon strip 212. As shown in later embodiments, the doping process 104 can comprise multiple masking and doping processes that implant different types of impurities into different regions of the single crystal silicon strip 212. This can include processes which leave one or more portions of the single crystal silicon strip 212 undoped. Through the doping process 104, many different types of semiconductor structures can be formed, such as insulators, conductors, diodes, transistors, etc. The doping concentrations and powers will vary depending upon the type of semiconductor structure being created within the single crystal silicon strip 212. For example, the doping impurities can include classical P-type and N-type impurities applied within any conventionally known or future developed concentration and power, such as the concentrations and powers mentioned in the conventional references.

Figure 5:
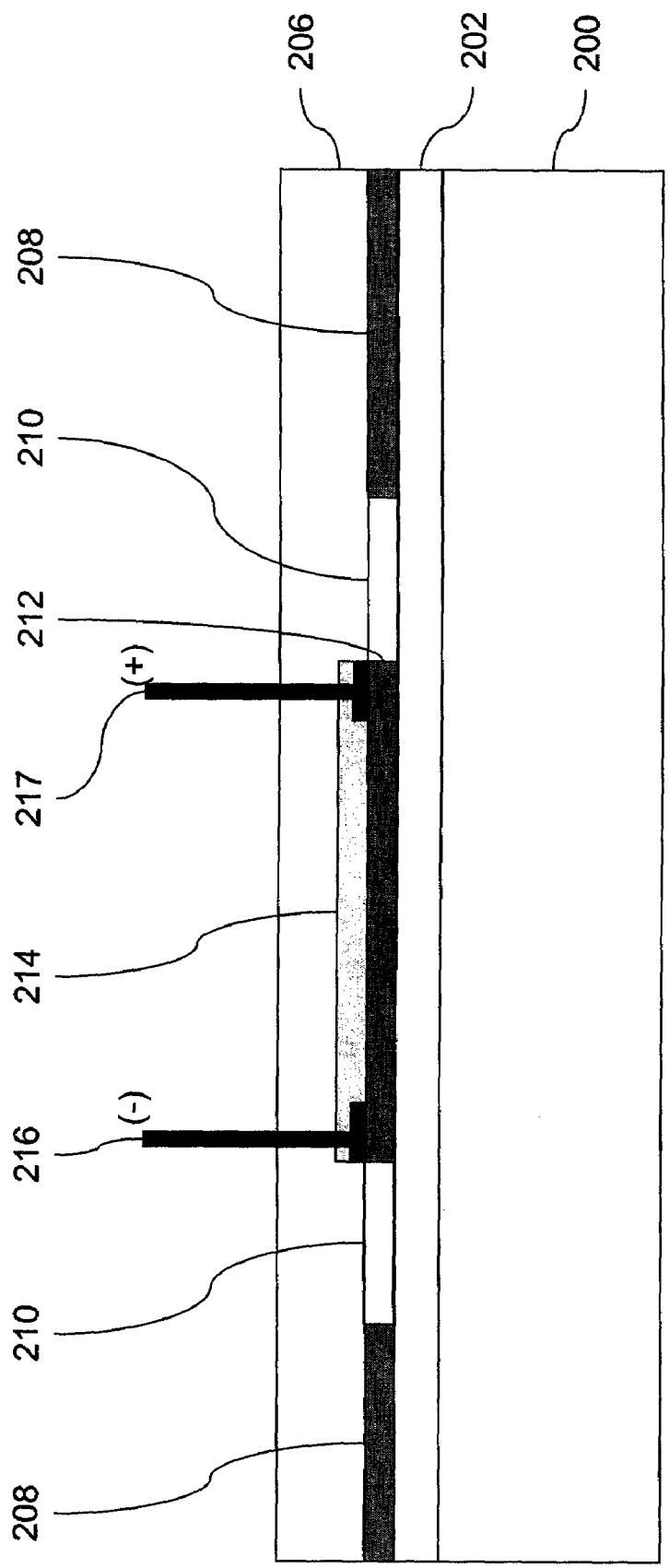
FIG. 5 is schematic cross-sectional diagram of an eFuse according to embodiments herein.

As shown in item 106 and FIG. 5, at least an upper portion of the single crystal silicon layer 212 is then silicided with a silicide 214 to form a silicided strip 212, 214. In one embodiment, discussed in greater detail below, the entire single crystal silicon strip is silicided to create a silicide strip. Any conventional silicide process, currently known or developed in the future, can be used with the invention, such as those discussed in the conventional references. For example, the single crystal silicon strip 212 can be heated in the presence of a metal or similar substance (such as nickel, titanium, cobalt, tungsten, etc.) to create the silicide layer 214 on the top portion of the single crystal silicon strip 212.

As also shown in FIG. 5, one or more second insulators 206 are formed on the silicide strip, so as to electrically and thermally isolate the silicided strip in three dimensions 212, 214 from surrounding structures (item 108). Before or after forming the second insulators 206, the method forms electrical contacts (item 110) through the second insulators 206 to ends of the silicided strip 212, 214, thereby completing the fuse structure.

The eFuse structure produced by the foregoing methodology comprises a strip of doped single crystal silicon 212 on a first insulator layer 202, a silicide layer 214 on the doped single crystal silicon 212, a second insulator layer 206, 210 on/around the silicide layer 214, and electrical contacts 216 that extend through the second insulator layer 206 and connect to ends of the strip of doped single crystal silicon 212. These insulators 202, 206, 210 thereby define the strip or island of single crystal silicon 212. In one embodiment, the silicide layer 214 and the doped single crystal silicon island 212 can comprise a substantially conductive member before the silicide layer 214 shifts position and can comprise a substantially non-conductive member after the silicide layer 214 shifts position.

Figure 6A:
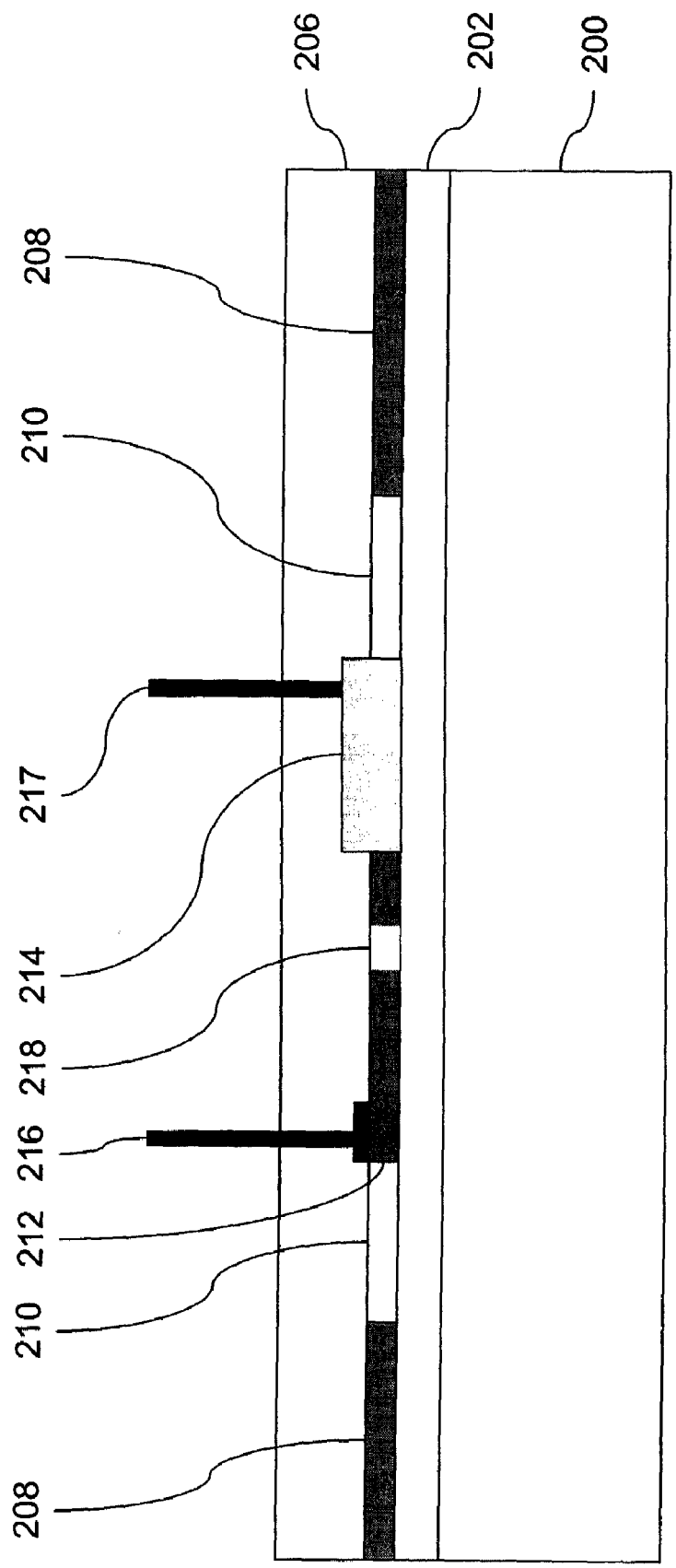
FIGS. 6A and B are schematic cross-sectional diagrams of programmed eFuses according to embodiments herein.

In its unblown state (shown in FIG. 5), the fuse acts as any normal conductor. However, when sufficient current is passed through the conductor, the silicide 214 melts and migrates (as shown in FIG. 6A). The amount of current necessary to program the fuse will vary depending upon the size of the fuse, the material used to form the silicide 214, and other factors. The actual value of current required to program the fuse can be predetermined through experiment and/or modeling and is generally designed to be significantly (e.g. 2×, 3×, etc.) greater than the currents that will be carried by the fuse during normal operating conditions (non-programming conditions) when the fuse is acting as a simple conductor or wire.

More specifically, the silicide layer 214 is adapted to move from an unblown position covering all of the doped single crystal silicon, to a blown position covering only one end of the doped single crystal silicon upon application of sufficient (predetermined quantity) current through the doped single crystal silicon 212 and silicon 214. As described in the conventional references, the silicide 214 migrates in the direction of current flow such that a large portion of the silicide 214 moves from the negative electrical contacts 216 (cathode) toward the positive electrical contact 217 (anode). While FIG. 6A illustrates a simplified example where all the silicide 214 moves toward one side of the fuse structure, in reality, some silicide 214 may remain at both ends of the fuse structure; however, when programmed, the silicide 214 is broken (discontinuous) such that it can no longer conduct electrical current between the electrical contacts 216, 217.

Figure 6B:
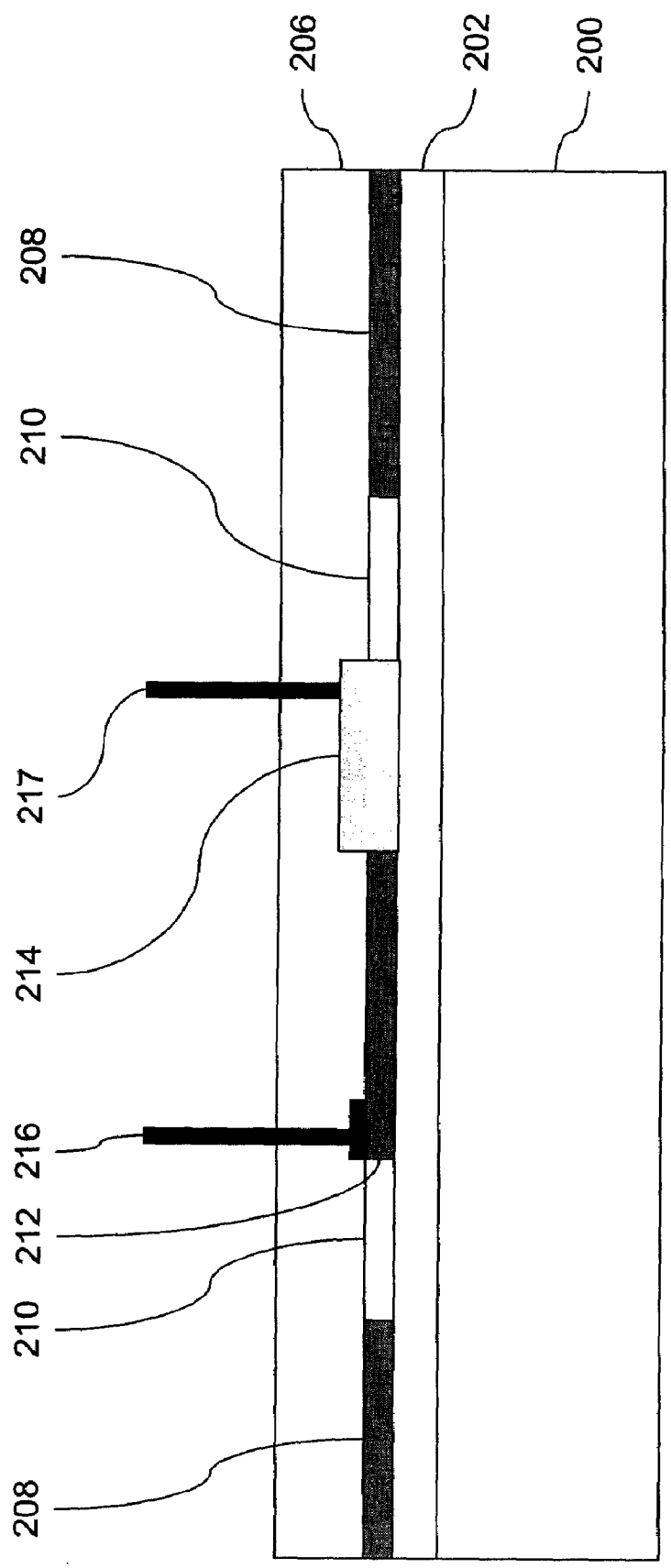

The predetermined current required to program the fuse melts the silicide 214 without substantially affecting the doped single crystal silicon 212 because the silicide 214 has a lower melting point than the underlying doped silicon strip. A shown in FIG. 6A, the application of current to the electrodes 216, 217 can be continued until sufficient heat is generated that the single crystal silicon strip 212 also melts and forms an optional void 218 therein. However, in embodiments where the doped single crystal silicon strip 212 is to be utilized as an active device, or a high resistance structure (transistor, diodes, etc.), no such void 218 is formed, and the doped single crystal silicon strip 212 remains intact after the programming process, as shown in FIG. 6B. Therefore, in some embodiments herein, the doped silicon strip 212 is substantially unaffected during the process of blowing the fuse.

While in its melted state during the fuse blowing process, the silicide 214 moves from a first (cathode) position covering all of the doped single crystal silicon island to a second (anode) position covering only one end of the doped single crystal silicon island. After the fuse blowing process, the silicide 214 cools and returns to a solid state and its position is thereby permanently changed. This melting and migrating process "blows," "programs," or "activates" the fuse. The process of blowing the fuse is permanent in that the conductivity of the fuse is permanently changed after the fuse blowing process.

By utilizing single crystal silicon (as opposed to polycrystal silicon), the inventive eFuse can comprise any form of semiconductor and can, therefore, include multiple doped regions which can have opposite doping polarities. For example, the doped single crystal silicon island can comprise an undoped region between doped regions that limits current flow through the doped single crystal silicon.

Figure 7:
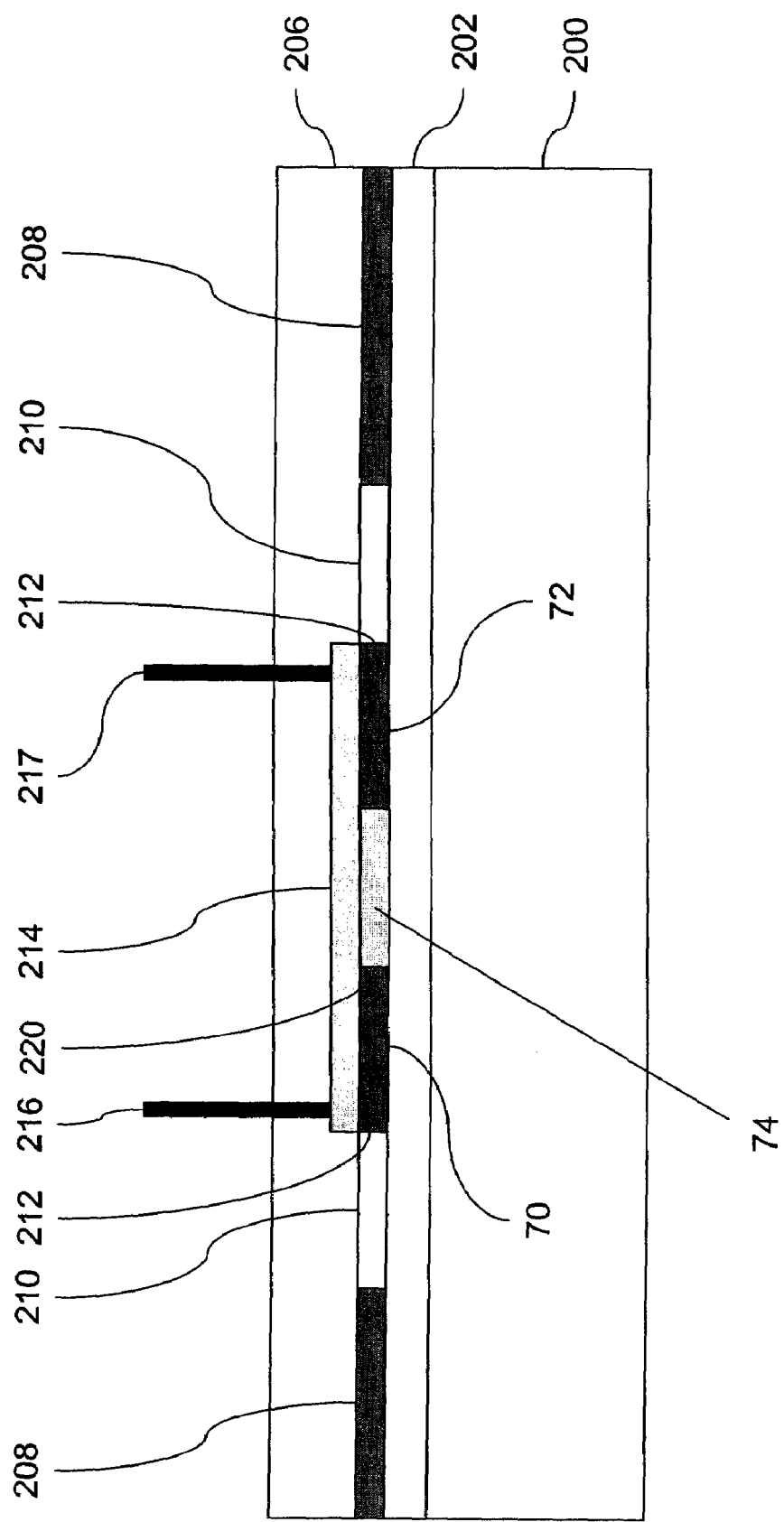
FIG. 7 is schematic cross-sectional diagram of an eFuse according to embodiments herein.

When doping 400 the single crystal silicon layer 212 in step 104, the method can dope a first region 70 of the single crystal silicon layer 212 to have a first doping and dope a second region 72 of the single crystal silicon layer 212 to have a second doping, as shown in FIG. 7, using any kind of multiple-step masking and impurity implementation process, such as those discussed in the conventional references. More specifically, the first region 70 can have an opposite type of doping polarity as the second region 72. Alternatively, the first and second regions 70, 72 can have the same polarity of dopant, and can have different doping concentrations within the different regions 70, 72. This would be understood by one ordinarily skilled in the art in light of this disclosure to include any combination of impurity strengths and doping polarities, to create any type of single crystal silicon-based semiconductor structure.

Further, the doping process can leave one or more regions 220 of the single crystal silicon layer 212 undoped. The one or more undoped regions 220 of the single crystal silicon layer 212 limit current flow through the single crystal silicon layer. Therefore, the placement, sizing, etc. of the undoped regions 220 can be selected to provide a feature that self-limits the programming current that will flow through the single crystal silicon strip 212, thereby helping to prevent damage to the single crystal silicon strip 212, especially during programming. This doping process can, for example, form a diode in the single crystal silicon layer 212. Therefore, the invention can comprise a normal conductor in an unblown state and comprise an active semiconductor device in its blown state.

Figure 8:
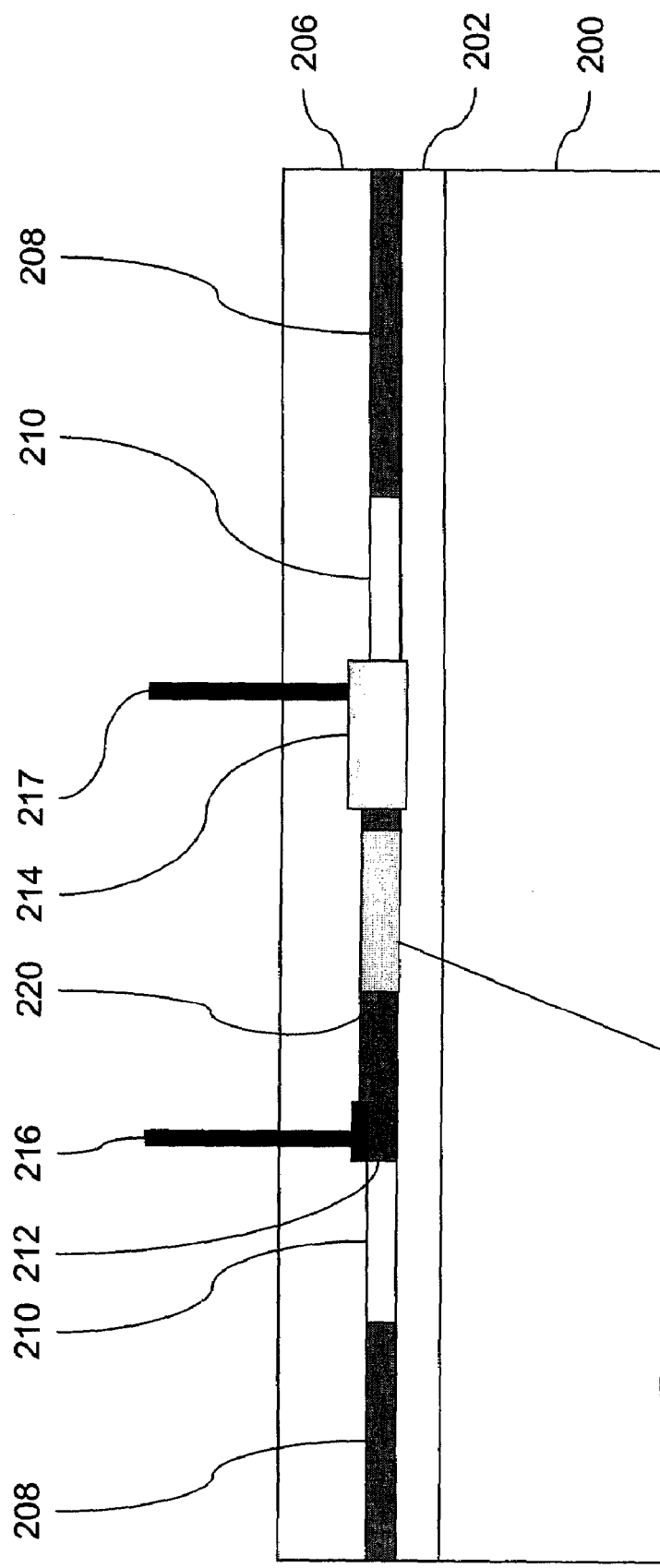
FIG. 8 is schematic cross-sectional diagram of a programmed eFuse according to embodiments herein.

FIG. 8 illustrates the structure shown in FIG. 7 in a programmed state where the silicide 214 has migrating toward electrode 217. Although the silicide is shown to migrate within region 72, this is not a necessary condition if only a single diode is present. In case of the diode, the silicide needs only to migrate within the dopant region 74.

In an eFuse where more than one region of the underlying fuse topology exists, by controlling the upper layer silicide migration, it is possible to have multiple device types within the fuse after programming it. A simple example follows. In FIG. 8, the silicide migration stops in region 72, thus uncovering three distinct semiconductor regions of the fuse, i.e. Region 70, 74, and 72. As one example, these three regions could form a Bipolar NPN or PNP transistor after programming as depicted in FIG. 8. However, if we chose to adjust the programming power such that the silicide only migrated into region 74, still covering region 72, then the resultant programmed structure (for this example) is a diode between 70 and 74. If once again we chose to adjust the programming power such that the resultant silicide migration stopped in region 70, covering regions 74 and 72, then the resultant programmed structure is a resistor. Thus, we have developed a subsystem to provide multiple device types (in this case 4 counting the base conductor) with in a single eFuse.

Figure 9:
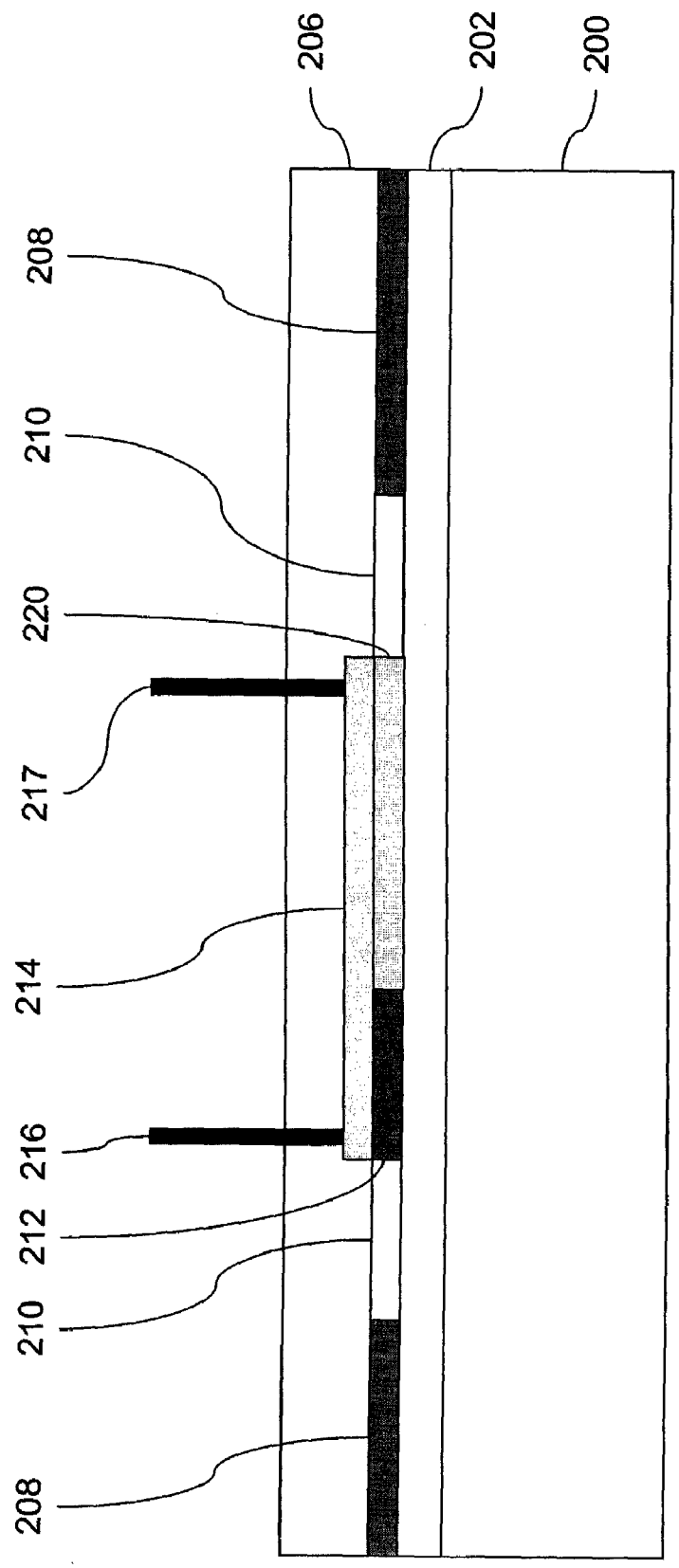
FIG. 9 is schematic cross-sectional diagram of an eFuse according to embodiments herein.
Figure 10:
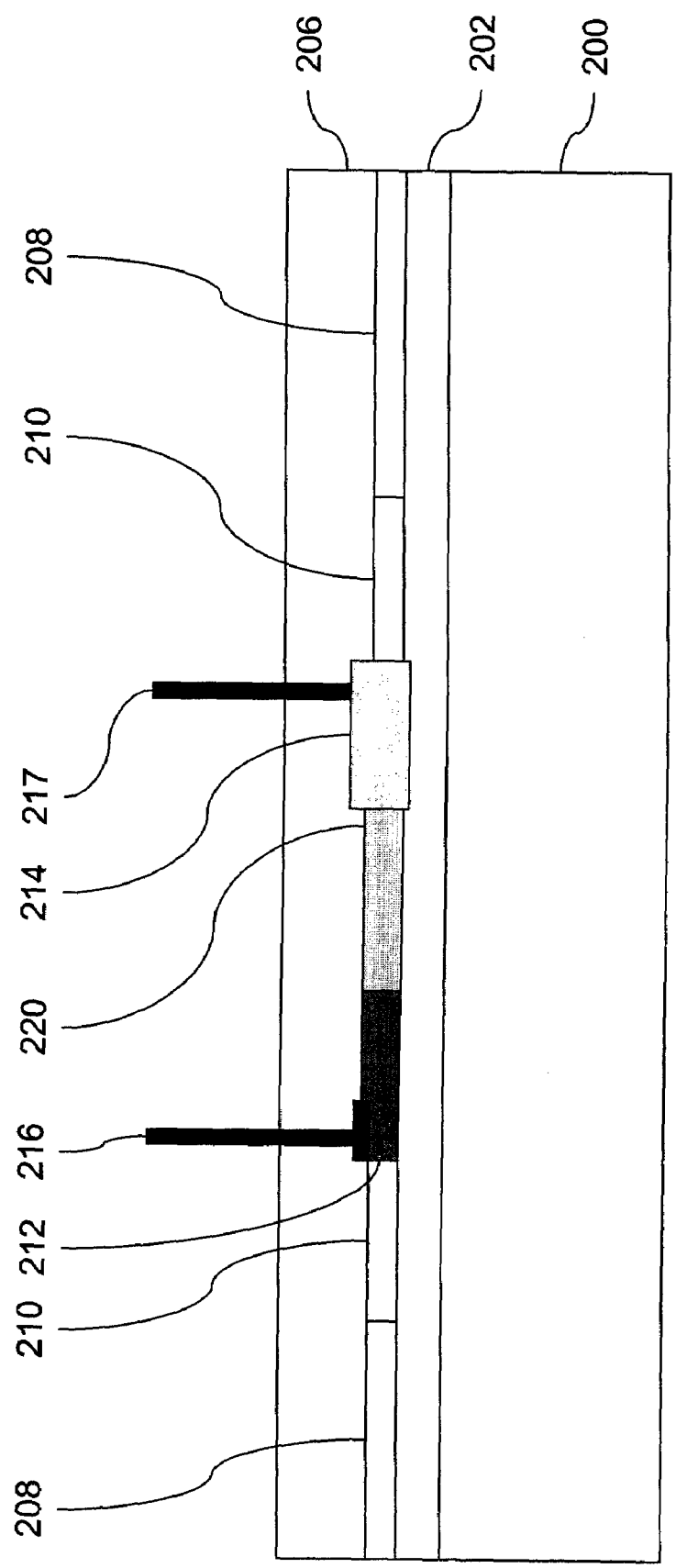
FIG. 10 is schematic cross-sectional diagram of a programmed eFuse according to embodiments herein.

FIG. 9 illustrates a similar structure that includes a single doped region 212 and a single undoped region 220 and FIG. 10 illustrates such a structure and a programmed state. As above, this structure through controlled programming stimulus can have three distinct states (unprogrammed, two regions uncovered, or one region uncovered). Having such a structure allows one to autonomically establish a programming condition, based on post programming characterization state of the eFuse.

Figure 11:
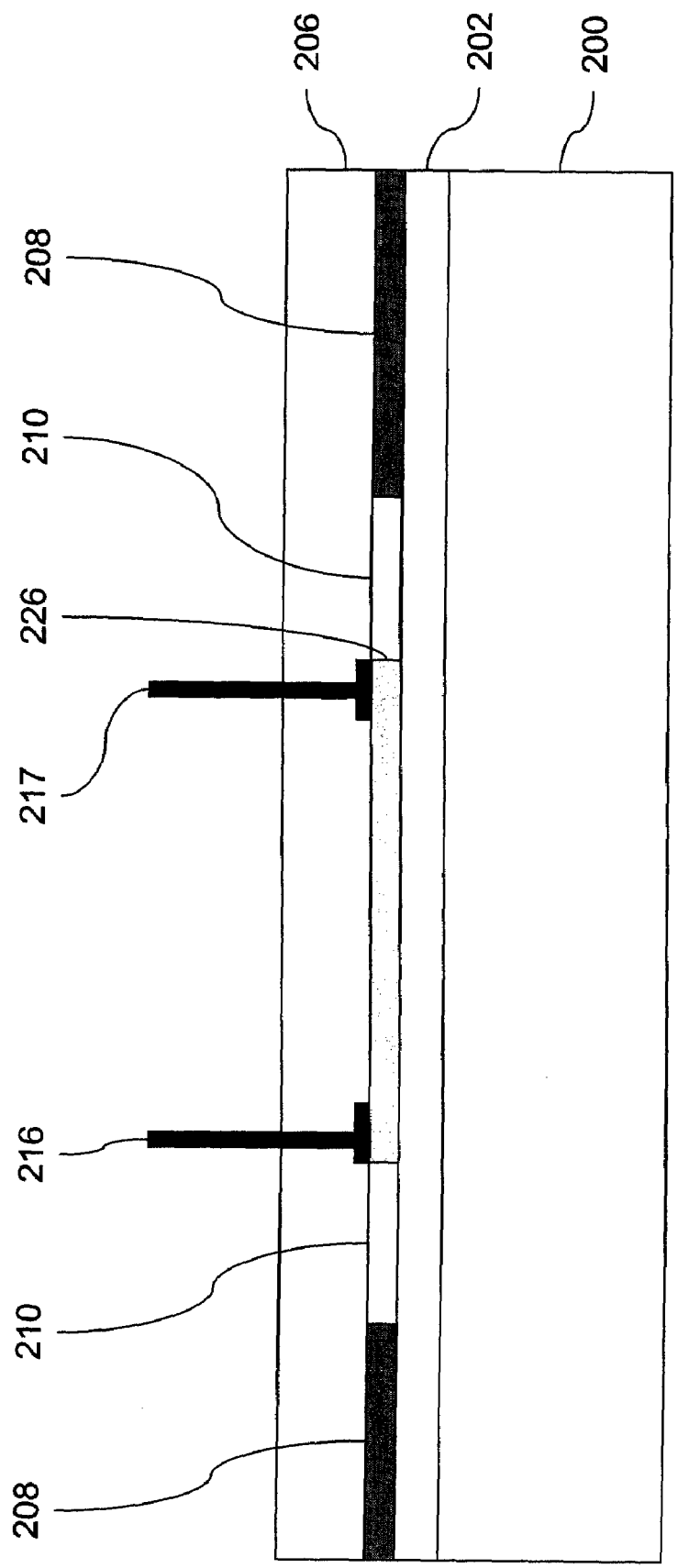
FIG. 11 is schematic cross-sectional diagram of an eFuse according to embodiments herein.
Figure 12:
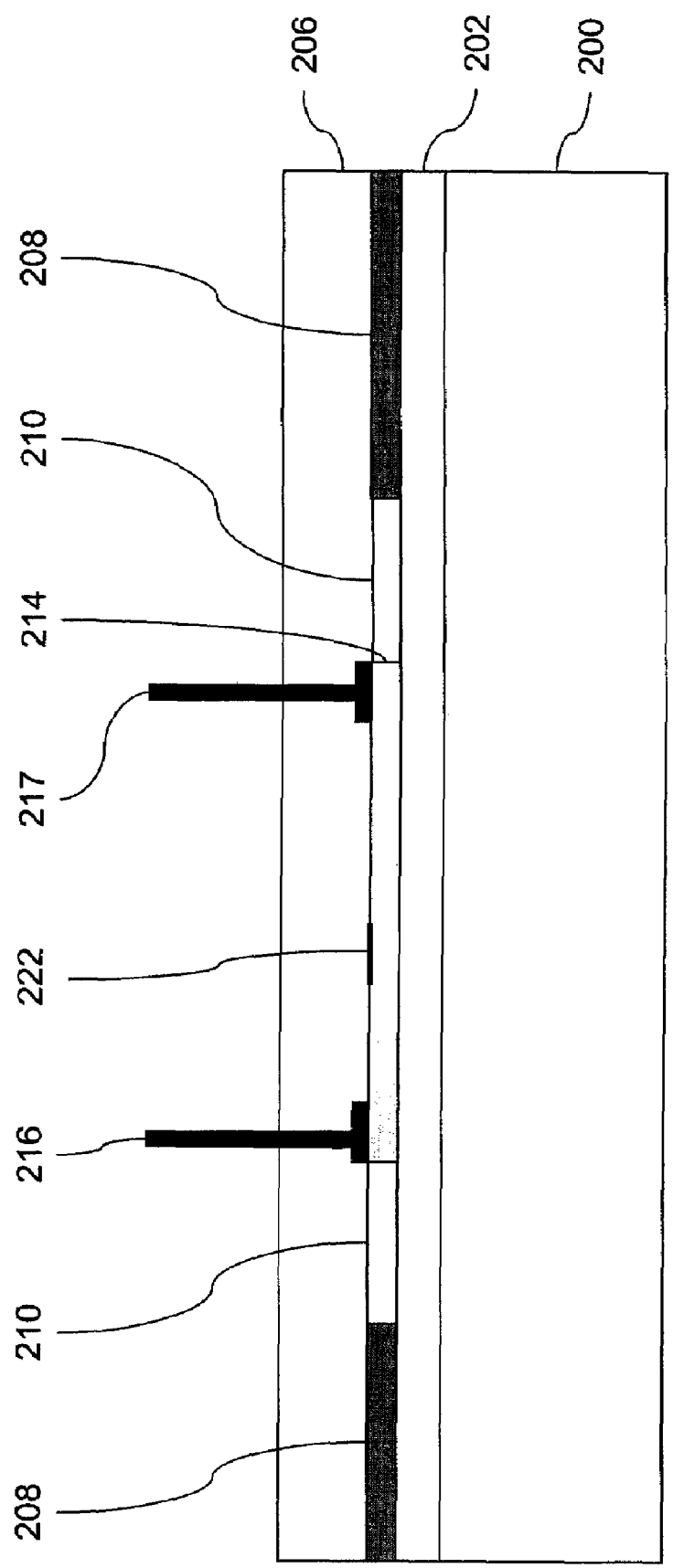
FIG. 12 is schematic cross-sectional diagram of a programmed eFuse according to embodiments herein.

FIGS. 11 and 12 illustrate an embodiment were the entire depth of the strip of single crystal silicon 212 is converted to silicide, thereby producing a silicide strip 226 that is completely (all) silicide. The method to produce the structure is also shown in FIG. 1; however, in this method, the entire single crystal silicon strip is converted to silicide (106) and the doping process (104) can be omitted. More specifically, the single crystal silicon-on-insulator (SOI) structure is provided (item 100), the single crystal silicon layer is patterned into a strip (item 102), all of the single crystal silicon layer is silicided (item 106) to form the silicide strip 226, at least one second insulator is formed on and around the silicide strip 226 so as to isolate the silicide strip from surrounding structures (item 108), and electrical contacts are formed through the second insulator to the ends of the silicide strip 226 (item 110).

As shown in FIG. 11, this produces an eFuse structure having a strip of silicide 226 on a first insulator layer 202, a second insulator layer 206, 210 on the silicide 226, and electrical contacts 216, 217 extending through the second insulator layer 206 and connecting to ends of the strip of silicide 226. As shown in FIG. 12, the silicide layer 226 is adapted to melt and become discontinuous (as indicated by void 222) upon application of current through the silicide strip 226. Therefore, this eFuse can comprise a conductor in an un-blown state and an insulator in a blown state.

As mentioned previously, when passing current through the electrical contacts 216, current flows from a first end of the silicided strip 212, 214 to a second end of the silicided strip 212, 214. In order to avoid damaging the contacts, the method forms a first contact at the first end of the silicided strip 212, 214 larger than a second contact at the second end of the silicided strip 212, 214.

As discussed above, when programming the inventive eFuses, the silicide layer 214 is adapted to move from an unblown position covering all of the doped single crystal silicon to a blown position covering only one end of the doped single crystal silicon upon application of sufficient (a predetermined quantity) current through the doped single crystal silicon. During this process of programming the eFuse, a relatively large amount of current passes through the electrical contacts 216 and through the strip of single crystal silicon 212, 214, 220. More specifically, the current flows from the first end of the strip of doped single crystal silicon to the second end of the strip of doped single crystal silicon. In order to prevent damage to the electrical contacts 216, 217, the inventive structure provides a first contact 216 at the first end of the strip of doped single crystal silicon that is larger than a second contact 217 at the second end of the strip of doped single crystal silicon, as shown in FIG. 13.

The method performs a number of steps to reduce the power required to program the fuse. In one embodiment, the method forms stress-producing sidewall spacers 224 (FIG. 14) along sidewalls of the strip of the single crystal silicon layer 212. The stress-producing sidewall spacers reduce the power required to program the fuse. Similarly, when patterning the strip of single crystal silicon the method can perform an etching process to taper the lower portion of the strip of the single crystal silicon layer 212. Again, the tapering lowers a power required to program the fuse. Additionally, the method can oxidize one or more portions of the strip of the single crystal silicon layer 212 so as to narrow the portions of the strip of the single crystal silicon layer 212. By narrowing the strip of single crystal silicon, the power required to program the fuse is also reduced.

Figure 14:
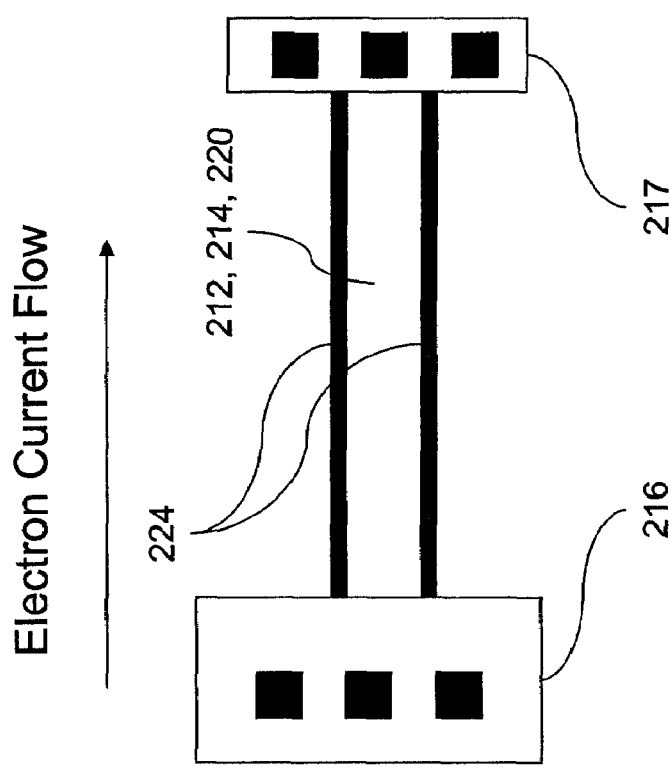
FIG. 14 is schematic top-view diagram of an eFuse according to embodiments herein.

More specifically, the method performs a number of steps to reduce the power required to program the fuse. In one embodiment shown in FIG. 14, the method forms stress-producing sidewall spacers 224 along sidewalls of the strip of the single crystal silicon layer. The stress-producing sidewall spacers reduce the power required to program the fuse. Thus, the inventive structure can include stress-producing sidewall spacers 224 lining sidewalls of the strip of doped single crystal silicon 212, 214, 220, as shown in FIG. 14. These sidewall spacers 224 can comprise any material known to create stress within single crystal silicon (such as nitrides, germanium, etc.). Indeed, any material that has different physical expansion/contraction characteristics can be formed along the sidewalls, top, and/or bottom of the single crystal silicon strip 212, 214, 220 to create stress within the strip 212, 214, 220. Any conventional methodology for forming sidewall spacers, such as that mentioned in the conventional references, can be utilized to form the sidewall spacers 224. For example, the stress-producing material 224 can be deposited over the single crystal silicon island 212, 214, 220, and a directional etching process (anisotropic) can be utilized to etch horizontal surfaces at a higher rate than vertical surfaces are etched, thereby leaving the stress producing material only on the sidewalls of the single crystal silicon island 212, 214, 220. Alternatively, separate stress producing layers can be formed above and below the single crystal silicon island 212, 214, 220 layer using well-known processing.

Figure 15:
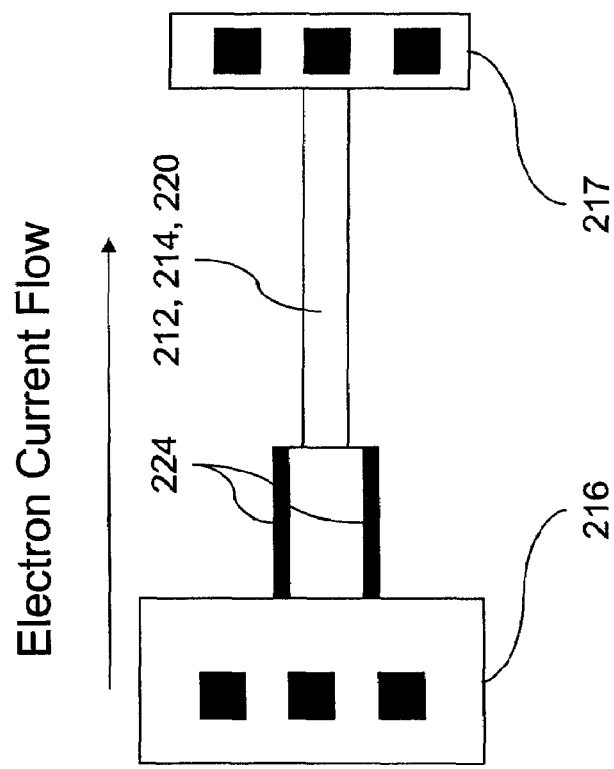
FIG. 15 is schematic top-view diagram of an eFuse according to embodiments herein.

In a different embodiment shown in FIG. 15, a masking process can be utilized to form the sidewall spacers 224 only along a portion of the single crystal silicon island 212, 214, 220. Then, oxidation, etching, and other similar material removal processes can be utilized to narrow the neck of the strip of single crystal silicon 212, 214, 220 as shown in FIG. 15. In this embodiment, the sidewall spacers 224 do not necessarily need to be stress-producing material layers, but instead can merely operate as a mask used in the narrowing process.

Similarly, when patterning the strip of single crystal silicon, the inventive method can perform an etching process to taper the lower portion of the strip of the single crystal silicon layer. Again, the tapering lowers the power required to program the fuse. More specifically, as shown in FIGS. 16 and 17, special crystolographic etching processes (such as KOH) can be utilized to taper the bottom portion of the strip of single crystal silicon 212, 214, 220. FIG. 17 most clearly illustrates that the bottom portion 212, 220 of the single crystal silicon strip (the portion opposite the top portion that will be silicide 214) is tapered.

Figure 18:
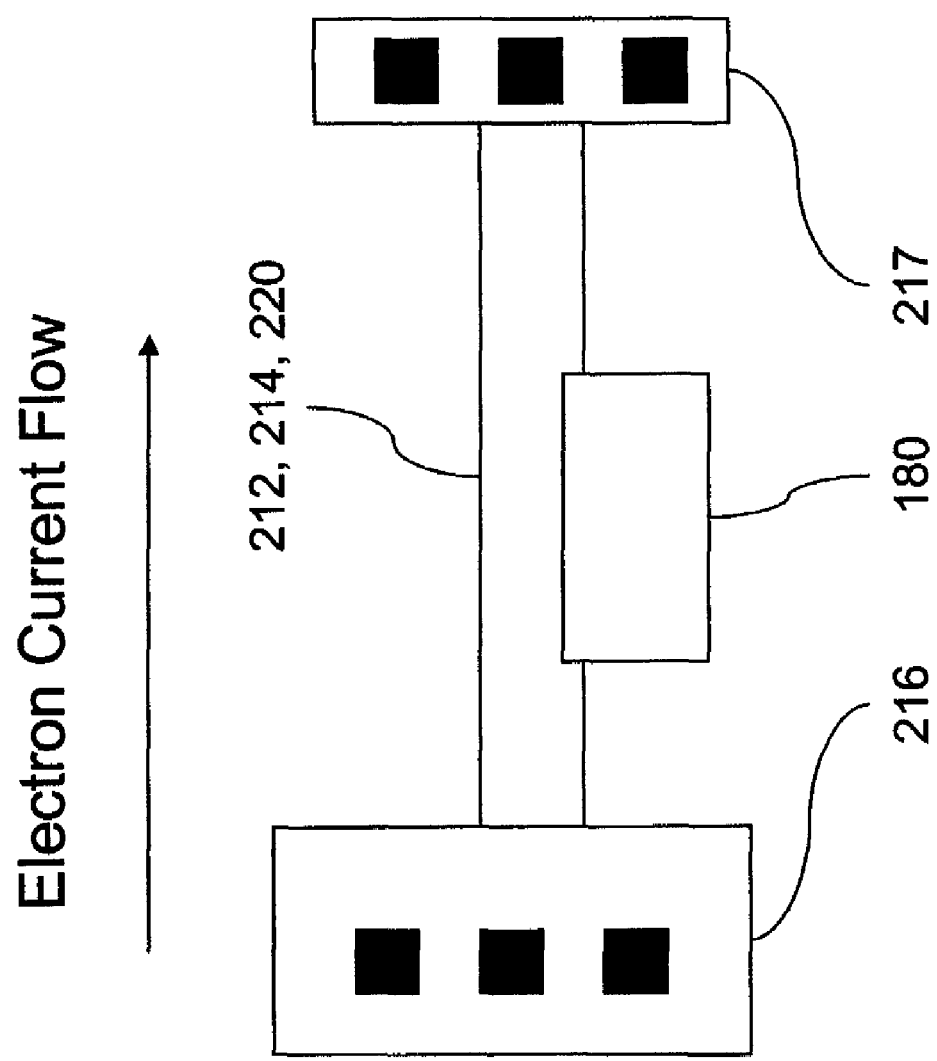
FIG. 18 is schematic top-view diagram of an eFuse according to embodiments herein.

Additionally, the method can oxidize one or more portions of the strip of the single crystal silicon layer so as to narrow the portions of the strip of the single crystal silicon layer. By narrowing the strip of single crystal silicon, the power required to program the fuse is also reduced. Thus, various portions of the single crystal silicon strip can be narrowed through oxidation processes, as shown, for example in FIG. 18. More specifically, in FIG. 18, a portion 180 of the single crystal silicon strip 212, 214, 220 is oxidized in a selective oxidation process which can use masking, heating, etc. (oxidization is well-known to those ordinarily skilled in the art). The oxidation process consumes a portion of the single crystal silicon strip 212, 214, 220, thereby narrowing the single crystal silicon strip 212, 214, 220.

As shown above, conventional eFuses can only be changed between conductors and insulators. To the contrary, the invention utilizes a single crystal silicon strip that is silicided in an eFuse structure. By utilizing a single crystal silicon strip, any form of semiconductor(s), such as a diode, insulator, conductor, and/or transistor, etc. can form the underlying portion of the fuse structure. The overlying silicide material allows the fuse to act as a conductor in its programmed state. However, contrary to metal or polysilicon based eFuses which only comprise an insulator in the programmed state, when the inventive eFuse is programmed (and the silicide is moved or broken) the underlying semiconductor structure operates as an active semiconductor device.

With the invention, the active SOI layer can now be used as a 3D isolated two terminal electrical eFuse. The semiconductor structures that result post programming, are of the same quality and reliability as any accompanying standard SOI silicon structure, by the nature of the fuse element being high quality single crystal silicon, versus polysilicon. A single crystal silicon layer will have a much improved PN junction electrical characteristic as contrasted to a diode formed in polysilicon.

While the invention has been described in terms of preferred embodiments, those skilled in the art will recognize that the invention can be practiced with modification within the spirit and scope of the appended claims.

What is claimed is:

1. An eFuse structure comprising:
   a strip of silicide formed contiguously on a first insulator layer;
   a second insulator layer formed on said strip of silicide; and
   electrical contacts extending through said second insulator layer and connecting to ends of said strip of silicide,
   wherein said strip of silicide comprises a fuse link that is adapted to move from an un-blown position, covering said first insulator layer, to a blown position, covering only a portion of said first insulator layer, upon application of current through said electrical contacts.

2. The eFuse structure according to claim 1, all the limitations of which are incorporated herein by reference, wherein said eFuse structure comprises a conductor in an un-blown state in which said strip of silicide electrically connects said electrical contacts.

3. The eFuse structure according to claim 1, all the limitations of which are incorporated herein by reference, wherein said strip of silicide is adapted to melt and become discontinuous upon application of current through said strip of silicide, thereby autonomically establishing a programming condition.

4. The eFuse structure according to claim 1, all the limitations of which are incorporated herein by reference, wherein:
   said eFuse structure comprises a non-conductor in a blown state, in which said strip of silicide does not electrically connect said electrical contacts; and
   said first insulator layer includes an electronic device.

5. The eFuse structure according to claim 4, all the limitations of which are incorporated herein by reference, wherein said electronic device includes at least two doped regions forming one of a diode, a transistor, and a dual diode.

6. The eFuse structure according to claim 4, all the limitations of which are incorporated herein by reference, wherein said first insulator layer is tapered, forming a narrowed electrical pathway through said first insulator layer, to reduce power required to program said eFuse structure.

7. The eFuse structure according to claim 1, all the limitations of which are incorporated herein by reference, further comprising stress-producing sidewall spacers adjacent to said first insulator layer, wherein said stress-producing sidewall spacers generate stress within said first insulator layer to reduce power required to program said eFuse structure.

8. The eFuse structure according to claim 1, all the limitations of which are incorporated herein by reference, wherein a portion of said first insulator layer is oxidized, forming a narrowed electrical pathway through said first insulator layer, to reduce power required to program said eFuse structure.

9. The eFuse structure according to claim 1, all the limitations of which are incorporated herein by reference, wherein:
   said first insulator layer includes an undoped region and a doped region; and
   said undoped region limits current flow through said first insulator layer.

10. The eFuse structure according to claim 1, all the limitations of which are incorporated herein by reference, wherein:
    said electrical contacts comprise a first electrical contact and a second electrical contact;
    current flows from said first electrical contact; and
    said first electrical contact is larger than said second electrical contact.

11. An eFuse structure comprising:
    a strip of silicide formed contiguously on a first insulator layer;
    a second insulator layer formed on said strip of silicide;
    electrical contacts extending through said second insulator layer and connecting to ends of said strip of silicide; and
    stress-producing sidewall spacers adjacent to said first insulator layer, wherein said stress-producing sidewall spacers generate stress within said first insulator layer to reduce power required to program said eFuse structure.

12. The eFuse structure according to claim 11, all the limitations of which are incorporated herein by reference, wherein said strip of silicide is adapted to melt and become discontinuous upon application of current through said strip of silicide, thereby autonomically establishing a programming condition.

13. The eFuse structure according to claim 11, all the limitations of which are incorporated herein by reference, wherein a portion of said first insulator layer is oxidized, forming a narrowed electrical pathway through said first insulator layer, to reduce power required to program said eFuse structure.

14. The eFuse structure according to claim 11, all the limitations of which are incorporated herein by reference, wherein:
    said first insulator layer includes an undoped region and a doped region; and
    said undoped region limits current flow through said first insulator layer.

15. The eFuse structure according to claim 11, all the limitations of which are incorporated herein by reference, wherein:
    said eFuse structure comprises a non-conductor in a blown state, in which said strip of silicide does not electrically connect said electrical contacts; and
    said first insulator layer includes an electronic device.

* * * * *